United States Patent
Gallegos et al.

(10) Patent No.: US 9,355,966 B2
(45) Date of Patent: May 31, 2016

(54) SUBSTRATE WARPAGE CONTROL USING EXTERNAL FRAME STIFFENER

(71) Applicant: Avago Technologies General IP (Singapore) Pte. Ltd., Singapore (SG)

(72) Inventors: Adam Gallegos, Fort Collins, CO (US); Walter J. Dauksher, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 34 days.

(21) Appl. No.: 13/937,040

(22) Filed: Jul. 8, 2013

(65) Prior Publication Data

US 2015/0008571 A1    Jan. 8, 2015

(51) Int. Cl.
*H01L 23/00* (2006.01)
*H01L 23/367* (2006.01)
(Continued)

(52) U.S. Cl.
CPC .............. *H01L 23/562* (2013.01); *H01L 23/16* (2013.01); *H01L 23/3675* (2013.01); *H01L 24/81* (2013.01); *H01L 24/83* (2013.01); *H01L 23/49816* (2013.01); *H01L 24/13* (2013.01); *H01L 24/16* (2013.01); *H01L 24/29* (2013.01); *H01L 24/32* (2013.01); *H01L 24/48* (2013.01); *H01L 24/92* (2013.01); *H01L 2224/10155* (2013.01); *H01L 2224/131* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13164* (2013.01); *H01L 2224/16225* (2013.01); *H01L 2224/26155* (2013.01); *H01L 2224/2919* (2013.01); *H01L 2224/32245* (2013.01); *H01L 2224/48225* (2013.01); *H01L 2224/73204* (2013.01); *H01L 2224/73253* (2013.01); *H01L 2224/81007* (2013.01); *H01L 2224/81191* (2013.01); *H01L 2224/81203* (2013.01); *H01L 2224/81801* (2013.01); *H01L 2224/83007* (2013.01); *H01L 2224/8346* (2013.01); *H01L 2224/8385* (2013.01); *H01L 2224/83203* (2013.01); *H01L 2224/83411* (2013.01); *H01L 2224/83424* (2013.01); *H01L 2224/83439* (2013.01);
(Continued)

(58) Field of Classification Search
CPC ....... H01L 23/562; H01L 24/83; H01L 24/81; H01L 23/16; H01L 23/3675
USPC ........................... 438/457; 257/676, E23.069
See application file for complete search history.

(56) References Cited

U.S. PATENT DOCUMENTS 6,433,412 B2 * 8/2002 Ando et al. .................... 257/678
6,444,497 B2 * 9/2002 Wensel et al. ................. 438/124
(Continued)

OTHER PUBLICATIONS

Manesh, GV. Electronics systems packaging technologies. Center for Electronics Design and Technology, Indian Institute of Science, Bangalore 560012.
(Continued)

*Primary Examiner* — Mohammad Islam
*Assistant Examiner* — John P Dulka

(57) ABSTRACT

A chip package and methods of manufacturing the same are disclosed. In particular, a chip package comprising a ball grid array is disclosed in which the chip package includes a package substrate supporting the ball grid array and in which the chip package further includes a warpage control frame that helps to minimize or mitigate warpage of the chip package.

20 Claims, 6 Drawing Sheets

(51) Int. Cl.
*H01L 23/16* (2006.01)
*H01L 23/498* (2006.01)
*H05K 1/14* (2006.01)
*H05K 3/34* (2006.01)

(52) U.S. Cl.
CPC ............... *H01L2224/83444* (2013.01); *H01L 2224/83447* (2013.01); *H01L 2224/92225* (2013.01); *H01L 2924/15311* (2013.01); *H01L 2924/167* (2013.01); *H01L 2924/1659* (2013.01); *H01L 2924/16152* (2013.01); *H01L 2924/19105* (2013.01); *H01L 2924/3511* (2013.01); *H05K 1/141* (2013.01); *H05K 3/3436* (2013.01); *H05K 2201/041* (2013.01); *H05K 2201/068* (2013.01); *H05K 2201/10378* (2013.01); *H05K 2201/10734* (2013.01)

(56) References Cited

U.S. PATENT DOCUMENTS

| | | | |
|---|---|---|---|
| 7,211,889 B2* | 5/2007 | Shim | H01L 23/10 257/707 |
| 8,836,098 B1* | 9/2014 | Sukemi et al. | 257/678 |
| 2005/0224954 A1* | 10/2005 | Kelly | 257/706 |
| 2006/0091562 A1 | 5/2006 | Lee | |
| 2011/0210436 A1* | 9/2011 | Chow | H01L 21/563 257/686 |
| 2014/0159224 A1* | 6/2014 | Okada | H01L 25/0655 257/690 |

OTHER PUBLICATIONS

Cho, Seunghyun et al. (2010). New dummy design and stiffener on warpage reduction in Ball Grid Array Printed Circuit Board. Microelectronics Reliability, vol. 50, Issue 2, pp. 242-250.

* cited by examiner

SUBSTRATE WARPAGE CONTROL USING EXTERNAL FRAME STIFFENER

FIELD OF THE DISCLOSURE

The present disclosure is generally directed toward substrates and specifically directed toward ball grid array assemblies.

BACKGROUND

Semiconductor manufacturers have exploited the advantages of ball grid array ("BGA") technology to help produce electronic devices that are smaller, faster, and more reliable. Unfortunately, through the increase of size of such BGA packages, the tendency for the package to warp due to inherent stresses increases. Specifically, package warpage has been observed during the elevated temperature processes due to the different coefficient of thermal expansion ("CTE") properties between the flip-chip package substrate material, copper conductor layers, the chip itself, and other substrate assembly materials. Moreover, because these packages also incorporate metal components, the propensity for internal stresses further increases, especially during lamination or adhesion steps. Practically speaking, a package that has warped more than a predetermined amount is rendered useless because the connectors of the package cannot physically connect to a rigid or planar Printed Circuit Board (PCB). Likewise, a highly warped substrate may not be able to contact a flip-chip. The problem is further exacerbated when a package is configured to have a large footprint—thus a smaller amount of warpage results in a larger displacement of the connectors at the outer extremes of the package.

BRIEF DESCRIPTION OF THE DRAWINGS

The present disclosure is described in conjunction with the appended figures.

DETAILED DESCRIPTION

Figure 1:
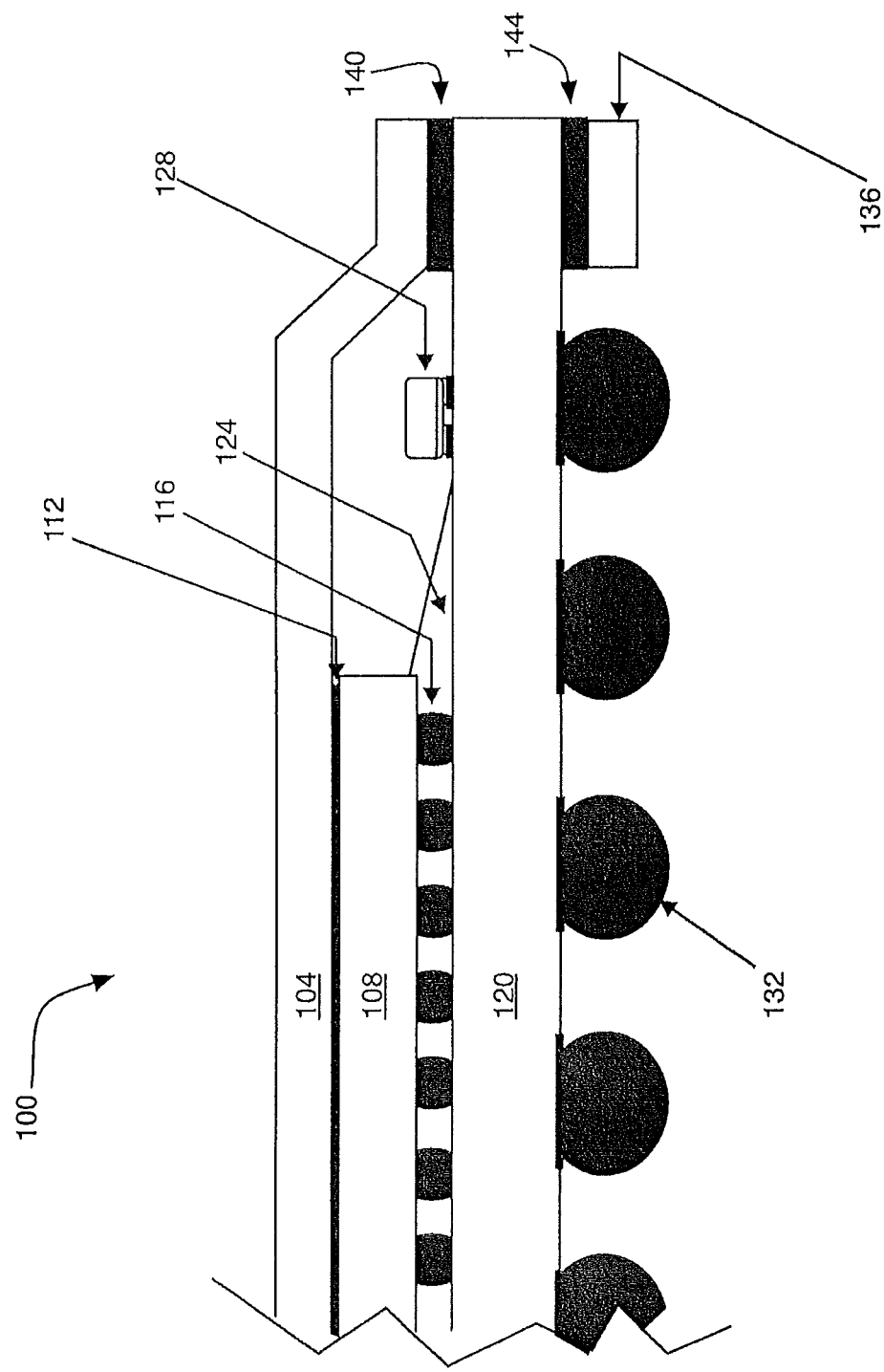
FIG. 1 is a cross-sectional view of a chip package in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

In one aspect of the present disclosure, a chip package is provided. In particular, a BGA assembly is provided with a substrate on which a chip and lid are provided. In some embodiments, the chip is connected to the package substrate with a plurality of bumps. A surface of the substrate which opposes the chip and lid may have a ball grid array provided thereon along with a warpage control frame. In some embodiments, the warpage control frame corresponds to a mechanical structure mounted on a common side of the package substrate as the ball grid array. In some embodiments, the warpage control frame is mounted in substantial opposition to a position where the lid is mounted to the substrate. The warpage control frame is configured to reduce the amount of warpage experienced by substrate alone due to disparate construction materials and by the chip package due to CTE mismatch between the package substrate, chip, and lid.

In another aspect of the present disclosure, a number of configurations of a warpage control frame are provided. The warpage control frame may simply span a perimeter of the substrate. In a more complex configuration, the warpage control frame may comprise one, two, three, four, . . . , ten, or more cross members that substantially bisect or traverse the primary surface of the substrate on which the ball grid array is provided. In some embodiments, the cross members may be provided in an orthogonal relationship between the perimeter of the warpage control frame. In some embodiments, the cross members may diagonally traverse the substrate.

In another aspect of the present disclosure, a method of manufacturing a chip package is provided that includes establishing a die on a substrate, establishing a lid on the substrate and die, providing a ball grid array on a surface of the substrate that opposes the lid and die, and then establishing a frame structure on the surface of the substrate on which the ball grid array is provided. The method may further comprise bonding the substrate to a PCB (e.g., via the ball grid array).

While details of certain embodiments will be described herein with reference to a BGA assembly, it should be appreciated that embodiments of the present disclosure are not so limited. In particular, it should be appreciated that the utilization of a warpage control frame may benefit other types of semiconductor and non-semiconductor devices. Specifically, embodiments of the warpage control frame described herein may be utilized in other semiconductor packages as well as other laminate structures where CTE mismatch and internal stresses due to lamination or heat induce structure warpage.

Referring now to FIGS. 1-5, potential configurations of a chip package 100 will be described in accordance with at least some embodiments of the present disclosure. The chip package 100 disclosed herein advantageously employs a warpage control frame 136 to limit or resist the warpage that would otherwise be induced in the chip package 100.

With specific reference to FIG. 1, the chip package 100 is depicted as including a lid 104, a chip 108, a thermal interface 112, a plurality of bumps 116, a package substrate 120, an underfill 124, one or more capacitors 128, a ball grid array 132, and a warpage control frame 136.

The lid 104 may correspond to a metallic or semi-metallic structure that has been stamped, etched, trimmed, etc. from a sheet of material. As a non-limiting example, the lid 104 may correspond to a stamped piece of copper, tin, steel, aluminum, silver, gold, or combinations thereof. The lid 104 is generally provided to provide a covering/protective structure for the other components of the package 100 and a rigid structure to help reduce further warpage of the substrate. In particular, the lid 104 may be configured to hermetically seal and/or protect components contained therein (e.g., chip 108) from mechanical shock, vibrations, impacts, or the like.

The chip 108 may correspond to a single die or multiple semiconductor dice. In some embodiments, the chip 108 corresponds to a semiconductor die for use in computing (e.g., as a microprocessor). The manner in which the chip 108 itself is manufactured can vary depending upon the desired operation of the package 100. As an example, the chip 108 may be manufactured using flip-chip technologies and the plurality of bumps 116 may be manufactured or provided as an integral part of the chip 108. The bumps 116 may provide the electrical connections to the various transistors junctions within the chip 108 and collectively, the chip 108 and bumps 116 may be referred to as an integrated circuit or IC chip. The bumps 116, in some embodiments, may correspond to a plurality of solder bumps and can be any type of electrically-conductive material such as gold, tin, silver, copper, palladium, aluminum, etc. It may also be possible to provide the bumps 116 on the chip 108 after the chip 108 has been manufactured and as part of connecting the chip 108 to the substrate 120.

Although the chip 108 is depicted as comprising a plurality of bumps 116 and has been described above as being manufactured in accordance with flip-chip manufacturing techniques, it should be appreciated that embodiments of the present disclosure are not so limited. Specifically, the chip 108 may correspond to a traditional semiconductor die and electrical connections between the chip 108 and the substrate 120 may be achieved with one or a plurality of bonding wires in addition to or in lieu of the bumps 116.

The substrate 120 may correspond to any single or multiple layered structure of materials. The substrate is typically fabricated using a multi-layer laminate structure, which includes a core material over which one or more layers are fabricated. The layers are typically fabricated on opposing sides of the core and generally include one or more power planes, ground planes, signal traces vias, and other electrically conductive interconnect layers, non-conductive layers, conductive structures, and other layers and structures. An example of the material that forms the core includes reinforced glass fibers with resins, such as FR4, etc. An example of the material used to form the conductive layers is copper. The non-conductive layers typically comprise solder mask material, also referred to as solder resist material, and can comprise epoxy resin, photosensitive resin, or other non-conductive material. The substrate structure is typically fabricated using known PC board fabrication techniques, and is typically fabricated at elevated temperature and pressure. In other words, any type of substrate known to be used in semiconductor packages may be utilized as the substrate 120 without departing from the scope of the present disclosure.

In some embodiments, the chip 108 is mounted to a first major surface of the package substrate 120 via the bumps 116. Although the first major surface of the substrate 120 is shown as a "top" surface in FIG. 1, it should be appreciated that the relative positions of "top" and "bottom" will only depend on a particular frame of reference and any mention of "top" or "bottom" herein should not be construed as unnecessarily limiting embodiments of the present disclosure.

Furthermore, an underfill material 124 may be provided to ensure that a proper bond is established between the substrate 120 and chip 108. The underfill material 124 may correspond to a curable liquid or semi-liquid adhesive that (1) protects the electrical connections between the chip 108 and substrate 120 and/or (2) mechanically reinforces the attachment of the chip 108 to the substrate 120. In some embodiments, the underfill material 124 may correspond to a non-conductive material, such as a thermosetting or UV-curable epoxy.

The lid 104 may be attached to the first major surface of the substrate 120 in addition to being attached to a top major surface of the chip 108. That is, the lid 104 may be attached to the same surface of the substrate 120 as that to which the chip 108 is attached. However, the lid 104 may be attached to an outer perimeter or extremity of the substrate 120 by an adhesive 140. The adhesive 140 may correspond to any type of known epoxy, glue, adhesive tape, or the like. The adhesive 140 in combination with the lid 104 help to create a protected environment for the chip 108, the bumps 116, and other components of the package 100. That is, the adhesive 140 may substantially surround the entirety of the chip 108 and may hermetically seal the chip 108 between the substrate 120 and the lid 104.

The thermal interface 112 which exists between the chip 108 and the lid 104 may provide a mechanism by which heat generated in the chip 108 can be dissipated by the package 100. Specifically, the thermal interface 112 may correspond to a thermally-conductive material that functions as a thermal pathway between the chip 108 and the lid 104. Heat that is generated within the chip 108 during operation may pass through the thermal interface 112 to the lid 104 where it can be dissipated into the surrounding environment. In some embodiments, the thermal interface 112 may also correspond to an adhesive, epoxy, or the like. Any other type of known thermally-conductive material may be used for the thermal interface 112.

The capacitor 128 and other types of auxiliary electronics may also be contained within the cavity formed by the lid 104 and bonded to the first major surface of the substrate 120. In some embodiments, the capacitor 128 may correspond to one or multiple capacitors 128 whose function is to protect the chip 108 from electrostatic discharges and other surges of electricity. The other types of components that may be provided in the cavity of the lid 104 include, without limitation, Zener diodes, diodes, inductors, resistors, and the like.

The substrate 120 further comprises a second major surface that opposes the first major surface. The second major surface of the substrate 120 may correspond to the outward facing surface of the package 100 that is intended for connection to an external circuit. Thus, the second major surface of the substrate 120 may be provided with a ball grid array in accordance with embodiments of the present disclosure. Other configurations (rectangular, non-rectangular, polygonal, circular, elliptical, etc.) may also be utilized for the substrate 120 and the BGA. Each of the pins in the ball grid array 132 may comprise one or more of gold, tin, aluminum, copper, silver, palladium, etc. Specifically, any type of material known or yet to be developed for used in a ball grid array 132 may be used in accordance with embodiments of the present disclosure.

As shown in FIG. 1, the warpage control frame 136 may also be attached to the second major surface of the substrate 120. The adhesive 144 may be similar or identical to the adhesive 140 used to connect the lid 104 to the first major surface of the substrate 120. Furthermore, the adhesive 144 may be positioned in substantially an opposing position with respect to adhesive 140, thereby causing the warpage control frame 136 to be mounted in opposition to locations where the lid 104 is mounted to the substrate 120. In other words, the warpage control frame 136 may be mounted to the perimeter or outer extremes of the substrate 120 similar to the way in which the lid 104 is mounted to the perimeter or outer extremes of the substrate 120. In some embodiments, the warpage control frame 136 may comprise a width of between about 0.5 mm and 1.5 mm but is dependent on the remaining area between the edge of the substrate to the ball grid array, while abiding to substrate assembly component placement guidelines.

In some embodiments, the warpage control frame 136 is constructed of a substantially rigid or stiff material that can help oppose the warpage of the package 100. As some non-limiting examples, the warpage control frame 136 may comprise one or more of a metal, ceramic, polymer, or any combination thereof. Even more specifically, the warpage control frame 136 may comprise any combination of copper, aluminum, ceramic, steel or a polymer filled with silica or alumina. Furthermore, although the warpage control frame 136 is depicted as comprising a substantially rectangular cross-section, it should be appreciated that any shape or combination of shapes may be used for the warpage control frame 136. As some non-limiting examples, the warpage control frame 136 may comprise a tube shape (e.g., circular or elliptical cross section), a polygonal cross section, a triangular cross section, or the like and the warpage control frame 136 may be connected to the second major surface of the substrate 120 with or without the use of a separate adhesive 144.

In some embodiments, the combination of the warpage control frame 136 and adhesive 144 comprise a thickness that is less than a thickness of the balls in the ball grid array 132. This ensures that the warpage control frame 136 does not substantially interfere with any bonds between the package 100 and an external circuit. In some embodiments, the warpage control frame 136 and adhesive 144 may comprise a collective thickness of between about 0.1 mm and 0.6 mm, and more preferably a thickness of between about 0.2 mm and 0.4 mm. Of course, the thickness of the warpage control frame 136 and adhesive 144 can vary depending upon the height of the ball grid array 132. In relative terms, the warpage control frame 136 and adhesive 144 may comprise a collective thickness that is between about 10% and 75% the height of the ball grid array 132.

Figure 2:
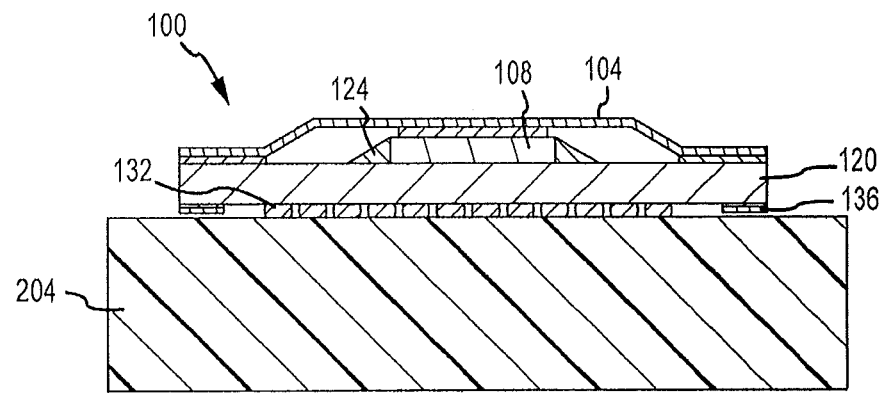
FIG. 2 is a cross-sectional view of a chip package connected to a PCB in accordance with embodiments of the present disclosure.
Figure 3:
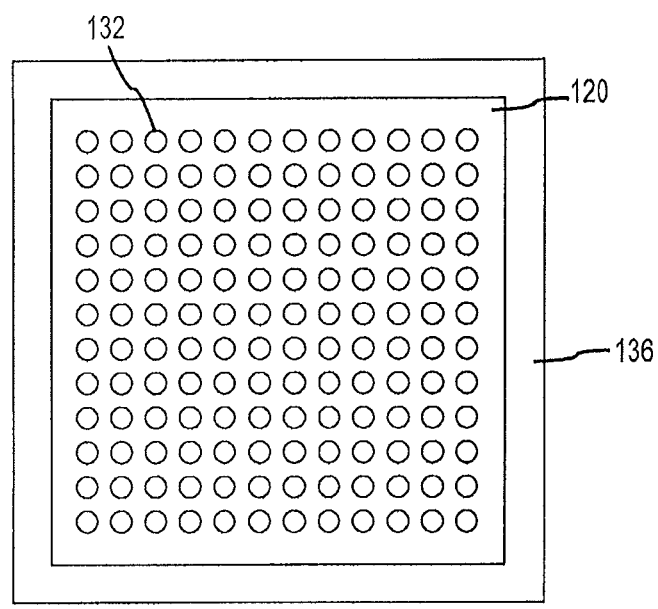
FIG. 3 is a bottom plan view of a chip package having a first configuration in accordance with embodiments of the present disclosure.

FIG. 2 further depicts how a completed package 100 can interface with an external circuit or PCB 204. FIG. 2 also depicts how the warpage control frame 136 may comprise a width that is less than a width of the section where the lid 104 attaches to the substrate 120. Again, both the lid 104 and warpage control frame 136 may be attached at the perimeter or outer extremes of the substrate 120, but the warpage control frame 136 may comprise a reduced width as compared to the lid connection. The skinnier warpage control frame 136 may create a larger area for the ball grid array 132 and/or reduce the overall size of the package 100. Specifically, as can be seen in FIG. 3, the reduction in thickness of the warpage control frame 136 directly translates to either a size reduction in the package 100 or a net area increase for the ball grid array 132. In either event, the warpage control frame 136 may have a reduced width as long as it can still function to counteract some internal stresses in the package 100 that might lead to warpage.

Additionally, although the PCB 204 is depicted as being a substantially rigid or planar PCB, it should be appreciated that embodiments of the present disclosure are not so limited. For instance, the PCB 204 may correspond to a flexible or semi-rigid PCB or any other circuit structure configured to have a ball grid array mounted thereto (e.g., using surface mount technologies or SMT).

Figure 4:
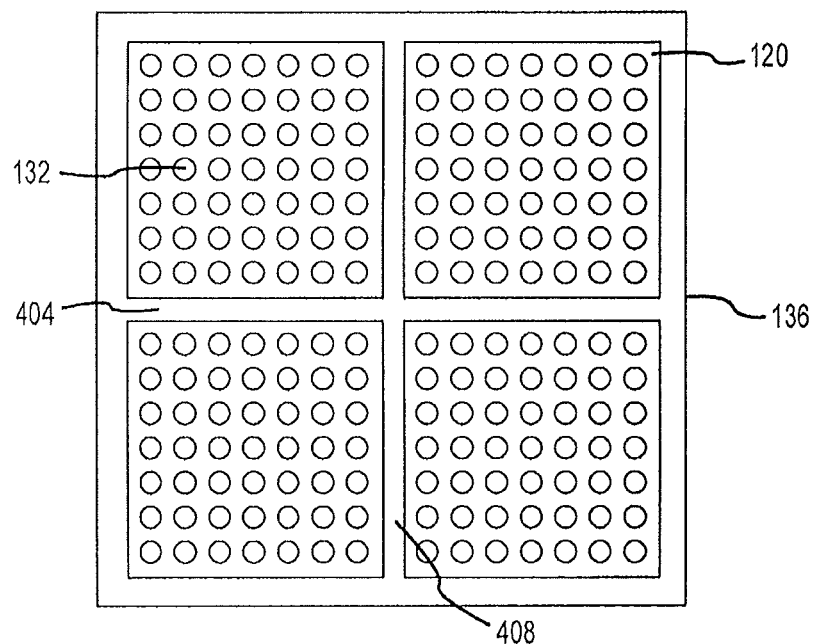
FIG. 4 is a bottom plan view of a chip package having a second configuration in accordance with embodiments of the present disclosure.
Figure 5:
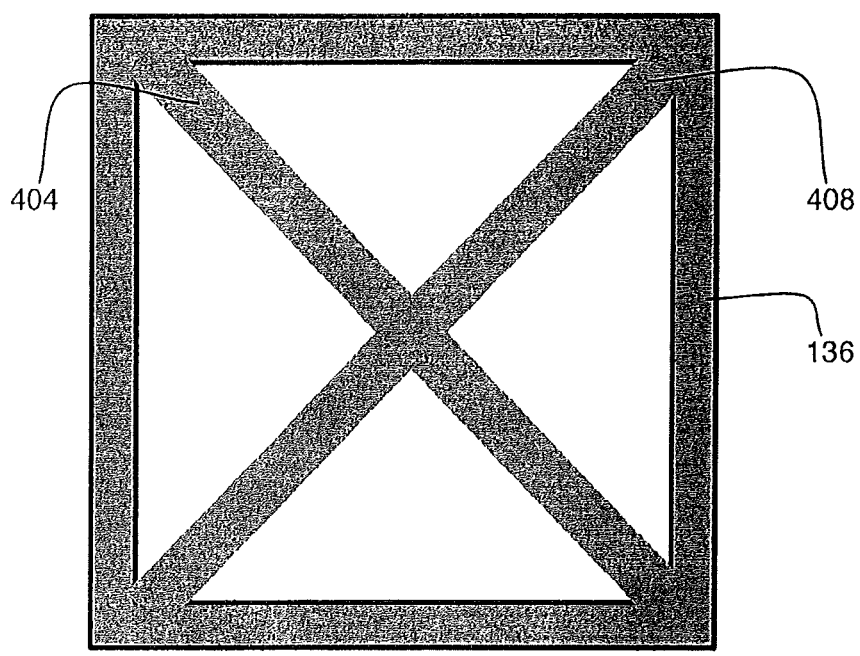
FIG. 5 depicts a third possible configuration of a warpage control frame that can be used in a chip package in accordance with embodiments of the present disclosure.

FIGS. 4 and 5 depict further configurations of a warpage control frame 136 that may be utilized in accordance with at least some embodiments of the present disclosure. Specifically, the warpage control frame 136 may comprise its perimeter member as well as one, two, three, or more cross members. FIG. 4 depicts a configuration in which the warpage control frame 136 comprises a first cross member 404 and a second cross member 408. The first cross member 404 and second cross member 408 may be attached to the second major surface of the substrate 120 in a similar fashion to that described above; however, the first cross member 404 may bisect or cross the ball grid array 132, thereby reducing at least one row of balls from the ball grid array 132. The depicted embodiment shows the first cross member 404 substantially bisecting the substrate 120 along its horizontal midpoint (e.g., across the middle of the substrate 120 and orthogonal to the perimeter portion of the warpage control frame 136). The second cross member 404 is depicted as substantially bisecting the substrate 120 along its vertical midpoint (e.g., across the middle of the substrate 120 and orthogonal to the first cross member 404). The second cross member 404 may further reduce at least one column of balls from the ball grid array 132.

Rather than reducing the number of balls in the ball grid array 132, the overall area of the substrate 120 may be increased to accommodate the cross member(s) 404, 408. In particular, it should be appreciated that the configuration of the ball grid array 132 can be adjusted if a more robust warpage control frame 136 is desired. As an example, a larger footprint package 100 may necessitate one or more cross members 404, 408 to further reinforce the warpage control frame 136. The addition of cross members 404 may be negligible as compared to the already large footprint of the package 100. Moreover, a larger footprint package may permit the substitution of the cross member(s) 404, 408 for unused pins.

FIG. 5 depicts a slight variation of the configuration depicted in FIG. 4. Specifically, FIG. 5 shows the first and second cross members 404, 408 diagonally traversing the second major surface of the substrate 120. Again, the cross members 404, 408 may be orthogonal to one another, but the cross members 404, 408 may terminate at the corners of the warpage control frame 136 perimeter rather than at the midpoints of the frame perimeter.

Although only three particular configurations of a warpage control frame 136 have been depicted herein, embodiments of the present disclosure are not so limited. In particular, the warpage control frame 136 may have any number of cross members, which may or may not intersect at the middle of the substrate 120. Furthermore, the width and/or thickness of the cross members 404, 408 does not necessarily have to equal the width and/or thickness of the perimeter section of the warpage control frame 136. Specifically, the cross members 404, 408 may comprise a width and/or thickness that is smaller as compared to the width and/or thickness of the rest of the warpage control frame 136.

Figure 6:
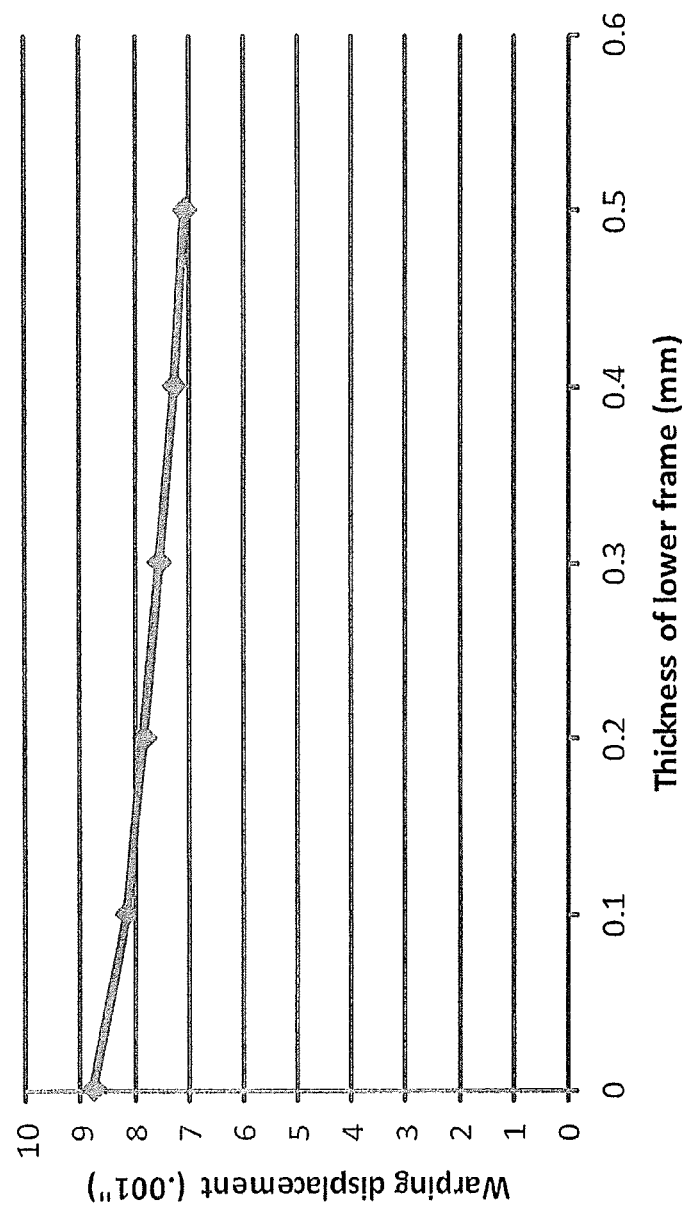
FIG. 6 is a chart depicting package warpage as a function of frame thickness in accordance with embodiments of the present disclosure.

FIG. 6 depicts data supporting the proposition that the warpage control frame 136 can be used to improve the structural performance of the package 100. Specifically, as the thickness of the warpage control frame 136 (in the configuration depicted in FIG. 3) is increased, the warpage displacement can be reduced. While the data of FIG. 6 was prepared in connection with the configuration of FIG. 3, it should be appreciated that all of the configuration depicted and/or described herein will experience similar improvements in performance.

Figure 7:
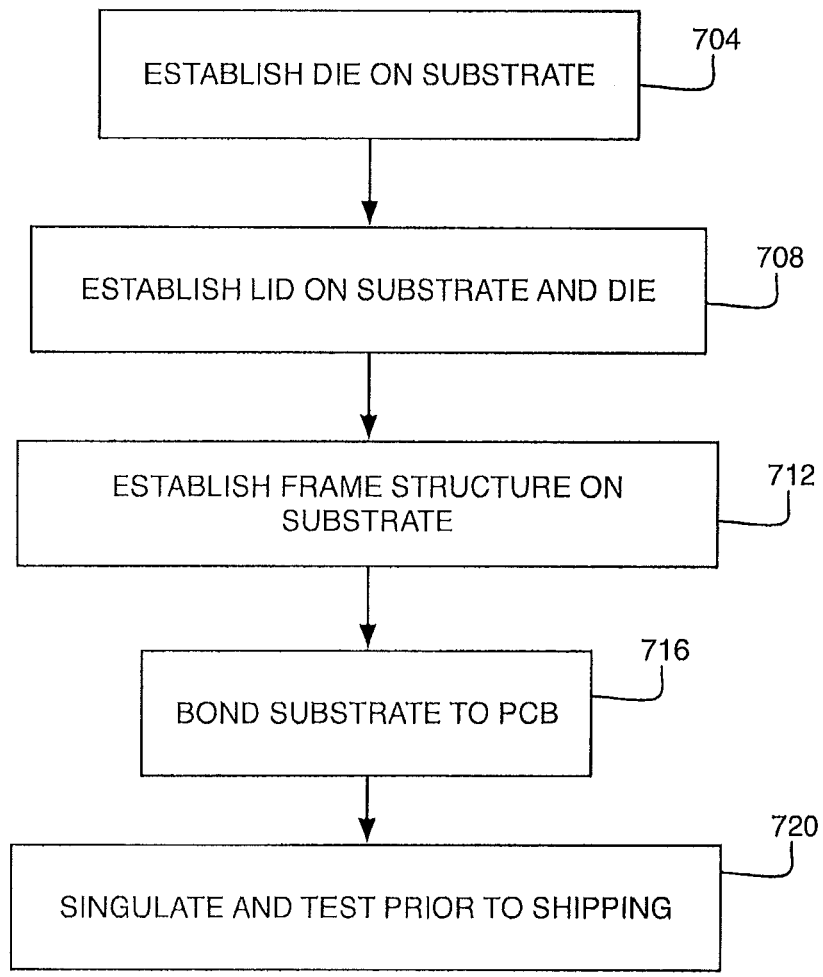
FIG. 7 is a flow chart depicting a method of manufacturing a chip package in accordance with embodiments of the present disclosure.

With reference now to FIG. 7, a method of manufacturing one or multiple packages 100 (e.g., in a bulk manufacturing process) will be described in accordance with at least some embodiments of the present disclosure. It should be appreciated that some steps shown herein may be performed in different orders and/or concurrently.

The method begins with the establishment of a semiconductor die or chip 108 on the substrate 120 (step 704). In some embodiments, the chip 108 may be attached to the substrate 120 via the plurality of bumps 116 on the first major surface of the substrate 120. Moreover, this particular step may further include the connection of the chip 108 to the substrate 120 with the underfill 124. If needed, one or more wire bonds may also be established between the chip 108 and substrate 120 in this step. Any other electrical components (e.g., capacitor 128) may also be connected to the first major surface of the substrate 120 in this step.

Following establishment of the chip 108 on the substrate 120, the method continues with the establishment of the lid 104 on the substrate 120 and die or chip 108 (step 708). In this step, the lid 104 may be connected to the chip 108 via the thermal interface 112 and further connected to the first major surface of the substrate 120 via the adhesive 140. This connection step may further comprise a lamination procedure whereby the lid 104, chip 108, and substrate 120 (and components therebetween) are subjected to one or more cycles of increased pressure and/or heat.

Before, after, or concurrent with step 708, the warpage control frame 136 may be established on the second major surface of the substrate 120 (step 712). In some embodiments, it may be desirable to attach the warpage control frame 136 to the substrate 120 prior to die and/or lid attachment (e.g., prior to steps 704 and/or 708) because steps 704 and/or 708 may involve a lamination process. The warpage control frame 136 may be useful to counteract or mitigate any possible warpage of the substrate 120 during these lamination processes. In some embodiments, the warpage control frame 136 is established on the substrate 120 with adhesive 144 via its own lamination process or during a combined lamination process with the chip 108 and/or lid 104.

After the package 100 is substantially prepared (e.g., the package 100 comprises a lid 104, chip 108, substrate 120, and warpage control frame 136), the method may continue with the bonding of the package 100 to a PCB 204 (step 716) and/or singulation of the package 100 (alone or with the PCB 204) away from other components manufactured during a batch manufacturing process (step 720). Once singulated, the package 100 may be tested for quality control purposes, either alone or in combination with the PCB 204.

Specific details were given in the description to provide a thorough understanding of the embodiments. However, it will be understood by one of ordinary skill in the art that the embodiments may be practiced without these specific details.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A semiconductor package, comprising:
    a substrate having a first major surface and an opposing second major surface;
    a semiconductor chip connected to the first major surface of the substrate via a plurality of electrically-conductive bumps;
    a lid connected to the first major surface of the substrate, wherein a connection between the lid and the first major surface of the substrate at least partially surrounds the chip and the plurality of electrically-conductive bumps, wherein the connection between the lid and the first major surface of the substrate is established at least at a perimeter of the first major surface of the substrate;
    a ball grid array established on the second major surface of the substrate; and
    a warpage control frame configured to control a warpage of the semiconductor package comprising:
        a perimeter section having a perimeter configured to match a perimeter of the substrate and the lid of the semiconductor package, the perimeter section further defining an internal void volume of the warpage control frame, wherein the perimeter section is configured to substantially surround the ball grid array such that a plurality of balls in the ball grid array structure are disposed within the internal void volume of the warpage control frame, the perimeter section comprising a thickness that is between 10% and 75% a height of the ball grid array structure;
        a first cross member that travels through the internal void volume separating the internal void volume into first and second internal void volumes such that the ball grid array structure is separated into a first plurality of balls disposed within the first internal void volume and a second plurality of balls disposed within the second internal void volume; and
        a second cross member that also travels through the internal void volume and intersects the first cross member such that the second cross member travels through the first and second internal void volumes further separating the first and second internal void volumes into smaller void volumes, wherein a divided plurality of balls in the ball grid array structure are disposed in each of the smaller void volumes.

2. The semiconductor package of claim 1, wherein the perimeter section of the warpage control frame is continuous and completely surrounds the ball grid array.

3. The semiconductor package of claim 2, wherein the perimeter section of the warpage control frame is connected to the second major surface via an adhesive at connection locations along the perimeter of the second major surface.

4. The semiconductor package of claim 3, wherein the lid completely surrounds the chip and is attached to the substrate at locations substantially opposite to the connection locations of the connected perimeter section of the warpage control frame.

5. The semiconductor package of claim 4, wherein the lid hermetically seals the chip, wherein the lid comprises at least one of copper, tin, steel, aluminum, silver, and gold, and wherein the lid is in thermal communication with the chip via a thermal interface such that heat produced in the chip is allowed to travel to the lid via the thermal interface.

6. The semiconductor package of claim 1 wherein the thickness of the warpage control frame is between 0.2 mm and 0.4 mm.

7. The semiconductor package of claim 1, wherein a width of the perimeter section is less than 1.0 mm.

8. The semiconductor package of claim 1, wherein the first cross member is connected to the perimeter section at two discrete points.

9. The semiconductor package of claim 8, wherein the first cross member has a thickness less than the thickness of the perimeter section.

10. The semiconductor package of claim 1, wherein the lid is configured to dissipate heat provided by the semiconductor chip to the substrate at least at the connection between the lid and the first major surface, wherein the lid has a first coefficient of thermal expansion (CTE), wherein the substrate has a different second CTE, and wherein the mechanical displacement of the substrate is caused by a mismatch between the first CTE and the second CTE.

11. A chip package, comprising:
- a semiconductor die;
- a substrate on which the semiconductor die is mounted;
- a lid that substantially seals the semiconductor die within a cavity established about the substrate, wherein the lid is attached to the substrate at least at a perimeter of the substrate;
- a ball grid array established on the substrate in opposition to the semiconductor die and the lid; and
- a warpage control frame connected to the substrate at least at the perimeter of the substrate and configured to prevent warpage of the substrate by providing mechanical reinforcement to the substrate on a side of the substrate opposite the attached lid, the warpage control frame comprising:
  - a perimeter section having a perimeter configured to match the perimeter of the substrate and the lid of the chip package, the perimeter section further defining an internal void volume of the warpage control frame, wherein the perimeter section is configured to substantially surround the ball grid array such that a plurality of balls in the ball grid array structure are disposed within the internal void volume of the warpage control frame, the perimeter section comprising a thickness that is between 10% and 75% a height of the ball grid array structure;
  - a first cross member that travels through the internal void volume separating the internal void volume into first and second internal void volumes such that the ball grid array structure is separated into a first plurality of balls disposed within the first internal void volume and a second plurality of balls disposed within the second internal void volume; and
  - a second cross member that also travels through the internal void volume and intersects the first cross member such that the second cross member travels through the first and second internal void volumes further separating the first and second internal void volumes into smaller void volumes, wherein a divided plurality of balls in the ball grid array structure are disposed in each of the smaller void volumes.

12. The package of claim 11, wherein the warpage control frame is established on the substrate such that it completely surrounds the ball grid array.

13. The package of claim 12, wherein the perimeter section of the warpage control frame is connected to the substrate via an adhesive at connection locations along the perimeter of the substrate.

14. The package of claim 11, wherein the warpage control frame is mounted to the substrate at mount locations substantially opposite to attachment locations of the attached lid.

15. The package of claim 14, wherein the lid comprises an elevated portion that is in contact with the semiconductor die via a thermal interface as well as a connection portion that is attached to the substrate via an adhesive, wherein the connection portion substantially surrounds the semiconductor die and wherein the connection portion directly opposes the lid where it attaches to the substrate.

16. The package of claim 15, wherein a width of the warpage control frame is less than a width of the adhesive that attaches the lid to the substrate.

17. The package of claim 11, wherein the warpage control frame comprises a stamped metal.

18. A warpage control frame adapted for use in controlling warpage of a chip package having a ball grid array structure, the warpage control frame comprising:
- a perimeter section having a perimeter configured to match a perimeter of a substrate and lid of the chip package, the perimeter section further defining an internal void volume of the warpage control frame, wherein the perimeter section is configured to substantially surround the ball grid array structure such that a plurality of balls in the ball grid array structure are disposed within the internal void volume of the warpage control frame, the perimeter section comprising a thickness that is between 10% and 75% a height of the ball grid array structure;
- a first cross member that travels through the internal void volume separating the internal void volume into first and second internal void volumes such that the ball grid array structure is separated into a first plurality of balls disposed within the first internal void volume and a second plurality of balls disposed within the second internal void volume; and
- a second cross member that also travels through the internal void volume and intersects the first cross member such that the second cross member travels through the first and second internal void volumes further separating the first and second internal void volumes into smaller void volumes, wherein a divided plurality of balls in the ball grid array structure are disposed in each of the smaller void volumes.

19. The warpage control frame of claim 18, wherein at least one of the first cross member and second cross member comprise a width that is different from a width of the perimeter section and wherein the first and second cross members are orthogonal to one another.

20. The warpage control frame of claim 18, wherein the first cross member has a thickness less than the thickness of the perimeter section.

* * * * *